(12) United States Patent
DeNies et al.

(10) Patent No.: US 7,292,457 B2
(45) Date of Patent: Nov. 6, 2007

(54) FOLDING LATCHING MECHANISM

(75) Inventors: Steven DeNies, East Aurora, NY (US); William Handley, Chandler, AZ (US); Mark D. Summers, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 251 days.

(21) Appl. No.: 11/096,529

(22) Filed: Mar. 31, 2005

(65) Prior Publication Data

US 2006/0221581 A1 Oct. 5, 2006

(51) Int. Cl.
*H05K 7/14* (2006.01)
*H05K 7/18* (2006.01)

(52) U.S. Cl. .................. 361/801; 361/802; 361/759; 439/157; 439/372; 439/160

(58) Field of Classification Search .............. 361/755, 361/740, 759, 801, 810; 30/153, 155; 439/157, 439/372, 160; 312/223.1, 223, 333; 292/194, 292/200, DIG. 11
See application file for complete search history.

(56) References Cited

U.S. PATENT DOCUMENTS 6,882,540 B2 * 4/2005 Conn et al. .............. 361/752
7,009,841 B2 * 3/2006 Chen et al. .............. 361/695
7,203,067 B2 * 4/2007 Beall et al. .............. 361/726

\* cited by examiner

*Primary Examiner*—Tuan T. Dinh
*Assistant Examiner*—Hung S Bui
(74) *Attorney, Agent, or Firm*—Blakely, Sokoloff, Taylor & Zafman LLP (57) ABSTRACT

A folding latching mechanism and related structure. An embodiment of the folding latching mechanism includes a latch member having a claw-shaped clasp disposed proximate to a pivot member that enables a pivotal coupling about a first pivot axis. A lever arm is pivotally-coupled to the latch member about a second pivot (fold) axis that is perpendicular to the first pivot axis of the latch member. During use, the latch member is rotated about its first pivot axis via the lever arm in an extended position, whereby the latching member is securely coupled to a frame member via its clasp. The lever arm is then rotated about its fold axis and secured in place. The folding latching mechanism may be employed on an Advanced Telecom Computing Architecture (ATCA) board hosting one or more Advanced Mezzanine Card (AdvancedMC) modules, wherein the mechanism does not interfere with the I/O port interfaces for the modules.

23 Claims, 12 Drawing Sheets

FOLDING LATCHING MECHANISM

FIELD OF THE INVENTION

The field of invention relates generally to computer and telecommunications equipment, and, more specifically but not exclusively relates to a non-interfering folding latching mechanism that may be used for ATCA carrier boards with AdvancedMC modules.

BACKGROUND INFORMATION

The Advanced Telecom Computing Architecture (ATCA) (also referred to as AdvancedTCA) standard defines an open switch fabric based platform delivering an industry standard high performance, fault tolerant, and scalable solution for next generation telecommunications and data center equipment. The development of the ATCA standard is being carried out within the PCI Industrial Computer Manufacturers Group (PICMG). The ATCA Base Specification, PIGMG 3.0 Revision 1.0, published Dec. 30, 2002 (hereinafter referred to as "the ATCA base specification") defines the physical and electrical characteristics of an off-the-shelf, modular chassis based on switch fabric connections between hot-swappable blades. The ATCA base specification supports multiple fabric connections, and multi-protocol support (i.e., Ethernet, Fibre Channel, InfiniBand, StarFabic, PCI Express, and RapidIO) including the Advanced Switching (AS) technology.

The ATCA specification defines the frame (rack) and shelf (chassis) form factors, core backplane fabric connectivity, power, cooling, management interfaces, and the electromechanical specification of the ATCA-compliant boards. The electromechanical specification is based on the existing IEC60297 EuroCard form factor, and enables equipment from different vendors to be incorporated in a modular fashion and be guaranteed to operate. The ATCA specification also defines a power budget of 200 Watts (W) per board, enabling high performance servers with multi-processor architectures and multi gigabytes of on-board memory.

Recently, the modularity of the ATCA architecture has been extended to another level, wherein hot-swappable, field-replaceable mezzanine cards (or modules) may be hosted by an ATCA carrier board. Standards for the mezzanine cards/modules and related interfaces are defined by the Advanced Mezzanine Card (AdvancedMC) (also called AMC) specification, PIGMG AMC.0, Revision 1.0, published Jan. 3, 2005 (hereinafter referred to as the AMC.0 specification). Optimized for packet-based, high-availability telecom systems, AdvancedMC modules can be attached to a variety of ATCA and proprietary carrier blades. AdvancedMC modules communicate with the carrier board via a packet-based serial interface, which features up to 21 lanes of high-speed input/output (I/O) at 12.5 Gbit/sec each. The specification defines standard mezzanine module configuration for both full-height and half-height AdvancedMC modules, as well as modules employing single-width and double-width cards. AdvancedMC is slated to support a variety of protocols, including Ethernet, PCI Express, and Serial Rapid I/O. AdvancedMC also features integrated $I^2C$- and Ethernet-based system management. AdvancedMC modules may also be employed for non-ATCA systems.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIGS. 6a-h show isometric views of an exemplary implementation of the folding latching mechanisms of FIGS. 4a-d when used to install an ATCA board in an ATCA chassis, wherein FIGS. 6a and 6b show the folding latching mechanisms in an initial configuration, FIGS. 6c and 6d show the folding latching mechanisms in a partially inserted position; FIGS. 6e and 6f show the latching member of the folding latching mechanisms in a latched position, with the lever arms in an extended position, and FIGS. 6g and 6h shown a latched position with the lever arms in a folded position;

DETAILED DESCRIPTION

Embodiments of folding latching mechanisms for rack-mounted boards and the like are described herein. In the following description, numerous specific details are set forth, such as implementations for Advanced Mezzanine Card (AdvancedMC) modules and Advanced Telecom Computing Architecture (ATCA) carrier boards and chassis, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

To better understand the operation and advantages of embodiments of the present invention, a discussion of the configuration and operation of conventional AdvancedMC modules and ATCA boards is first presented. Details of various embodiments that may be employed for ATCA boards that support use of AdvancedMC modules then follow.

As discussed above, the ATCA base specification defines the frame (rack) and shelf (chassis) form factors, core backplane fabric connectivity, power, cooling, management interfaces, and the electromechanical specification of the ATCA-compliant boards. In addition to power input to ATCA boards, mating connectors on the boards and backplane are employed for coupling input/output (I/O) signals. Many of the ATCA boards, as well as other modular boards used for telecommunications and computer, such as but not limited to CompactPCI, employ very-high speed I/O channels. For example, Advanced Switching (AS) employs a serial communication channel operating at Gigahertz+frequencies. This necessitates excellent pin coupling to support signal transmission across the connectors.

To support excellent pin coupling, the ATCA base specification defines a board insertion mechanism that includes a pair of handles (a.k.a. "latches" or "levers") that are used to urge the board inward in the chassis to "drive" the pins in the connectors mounted at the rear of the board into mating receptacles in the corresponding connectors mounted on the backplane. The handles provide a lever function to enable a board to be inserted without having to supply a large amount of force to the board itself, thus reducing the chance of damaging the board. Similar mechanisms are used for other board form factors.

Figure 1:
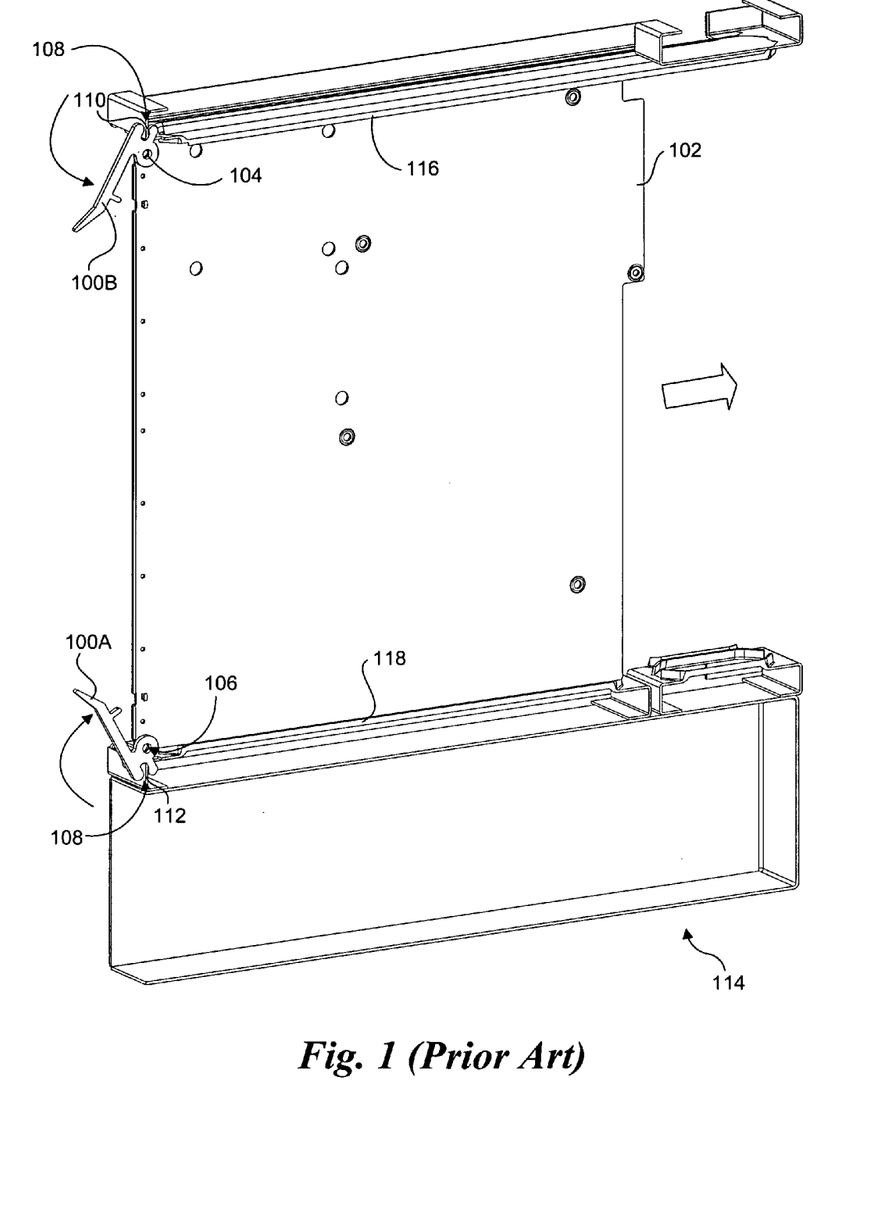
FIG. 1 is an isometric view of an conventional latching mechanism employed for latching an Advanced Telecommunication Architecture (ATCA) board into an ATCA chassis.

In further detail shown in FIG. 1, the conventional board insertion mechanism employs a pair of handles 100A and 100B, each of which is pivotally-coupled to a board carrier frame 110 via respective pivots 104 and 106. (It is noted that the ATCA base specification refers to a board carrier frame as a "front board faceplate.") Board carrier frame 102 also includes a faceplate that has been removed via a section cut in FIG. 1 to more clearly depict how the conventional insertion mechanism operates.

Under a typical implementation, an ATCA carrier board is mounted to a board carrier frame 102. However, for illustrative purposes, actual ATCA carrier boards are not shown in some of the drawings herein in order to not obscure the operations of the handle-coupling mechanisms. In general, the handle-coupling mechanisms are disposed between the frontside of a board carrier frame and the backside of a carrier board. It is further noted that in other embodiments, the handles and handle-coupling mechanisms described herein may be coupled directly to a board, rather than coupled to a board carrier frame.

During operation, a force is applied to handles 100A and 100B to rotate the handles about respective handle pivots 104 and 106. As a handle is rotated inward, a claw-shaped clasp 108 engages a flange or the like in a card rack (e.g., ATCA chassis) in which the board is to be inserted. In FIG. 1, these include an upper flange 110 and a lower flange 112, which are part of an ATCA chassis 114 (shown in cut-away view). As the handles 100A and 100B are rotated inward, the clasps 108 begin to engage upper and lower flanges 110 and 112, urging board carrier frame 102 toward the rear of ATCA chassis 114, wherein the upper and lower edges of the board carrier frame (or ATCA carrier board) slide within upper and lower guides 116 and 118. The inward rotation of handles 110A and 100B is continued until the handles reach a "closed" or "latched" position.

Figure 2:
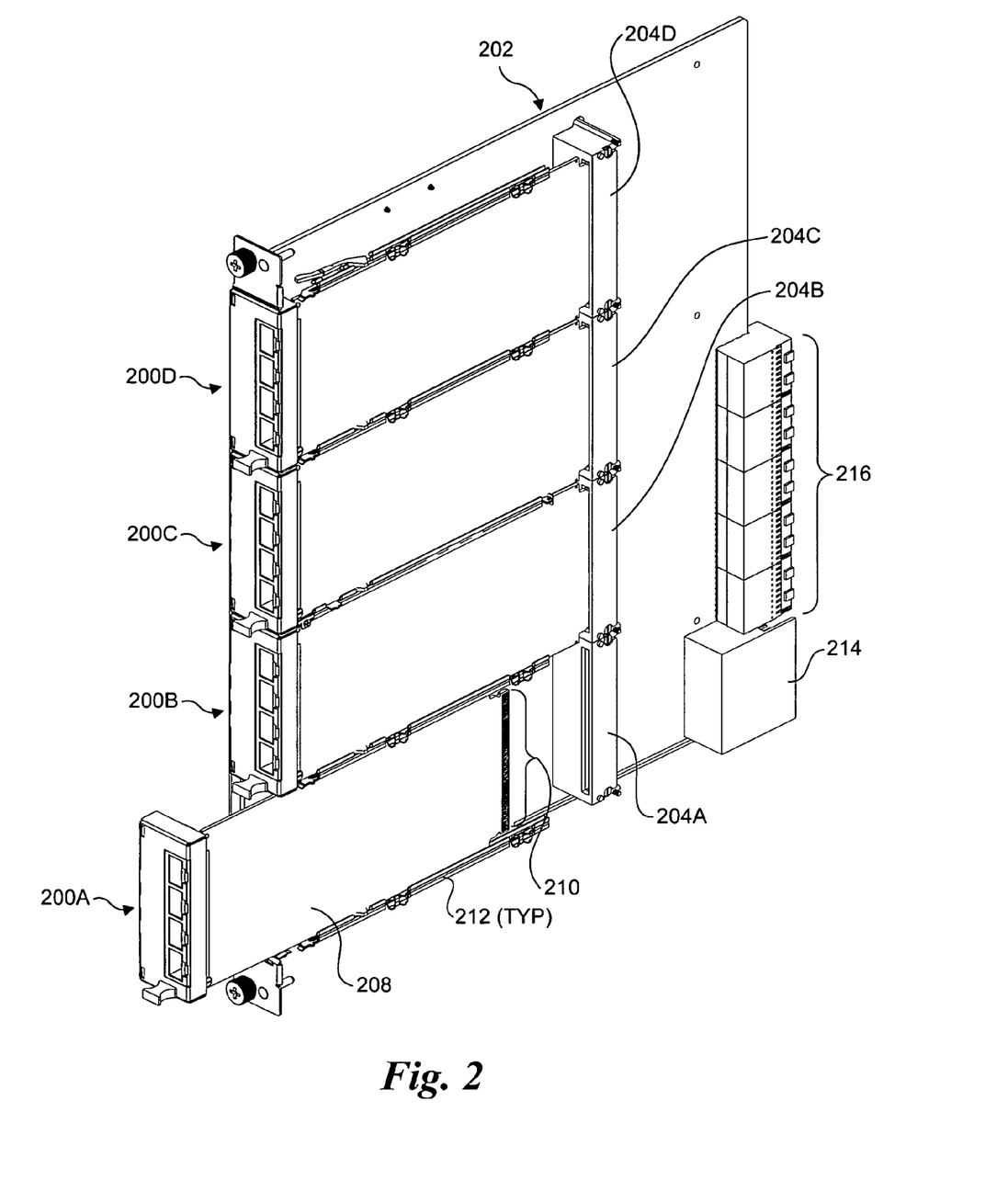
FIG. 2 is an isometric view of an Advanced Telecommunication Architecture (ATCA) carrier board to which four full-height single-width Advanced Mezzanine Card (AdvancedMC) modules are coupled.

FIG. 2 shows an exemplary AdvancedMC module implementation wherein four single-width full-height AdvancedMC modules 200A, 200B, 200C, and 200D are installed on an ATCA carrier board 202. In general, ATCA carrier boards may have various configurations, depending on the number and type of AdvancedMC modules the carrier board is designed to host. For example, ATCA carrier board 202 includes four AdvancedMC connectors 204A, 204B, 204C, and 204D. An ATCA carrier board may also be configured to support double-width full-height AdvancedMC modules, or a combination of single-width and double-width full-height AdvancedMC modules.

Under the AMC.0 specification, full-height AdvancedMC connectors are referred to as Style "B" (basic) or "B+" (extended) connectors. The term "basic" is associated with AdvancedMC connectors that are equipped with contacts on only one side of the connector slot. The term "+" identifies the connector as an extended connector having contacts on both sides of the connector slot. A single-width AdvancedMC module includes a single-width AdvancedMC card 208 having a single-width edge connector 210. As with its mating connector, a single-width edge connector may include contacts on a single side (basic) or both sides (extended).

The horizontal (or longitudinal) card edges of an AdvancedMC card are guided via a set of guide rails 212 disposed on opposing sides of the card. An ATCA carrier board also includes a power connector 214 via which power is provided to the carrier board from an ATCA chassis backplane, and various input/output (I/O) connectors 216 via which signals are routed to the backplane, and hence to other ATCA boards and/or AdvancedMC modules (mounted to other ATCA carrier boards) that are similarly coupled to the ATCA backplane.

Generally, the circuit components on an AdvancedMC module PCB card will be disposed on the side of the card facing the top or front side of the corresponding carrier board. This protects the circuitry, among other reasons for the configuration. To add further protection, an ATCA carrier board assembly will typically include a cover plate that is disposed over the backside of the AdvancedMC module PCB cards; the ATCA carrier board assemblies of FIGS. 2 and 3, do not show the cover plate for clarity in illustrating how the PCB card edge connectors are mated to corresponding AdvancedMC connectors under a conventional implementation.

Figure 3:
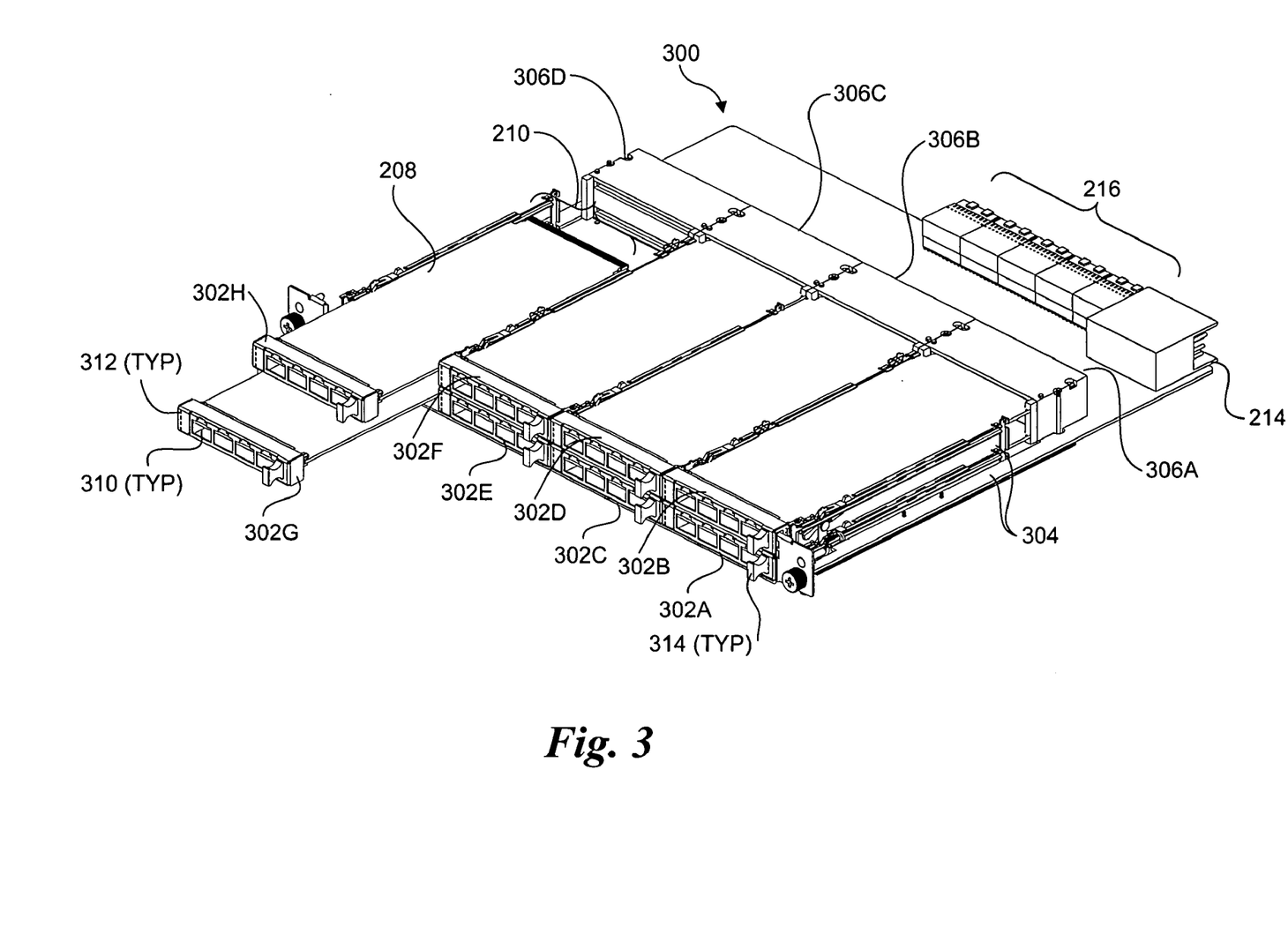
FIG. 3 is an isometric view of an ATCA carrier board to which to eight half-height single-width AdvancedMC modules are coupled.

In addition to full-height AdvancedMC modules, the AMC.0 specification defines use of single- and double-width half-height modules that may be stacked in a pair-wise manner that supports up to eight single-width, half-height modules. For example, such a configuration is shown in FIG. 3, which includes an ATCA carrier board 300 configured to support eight single-width single height AdvancedMC modules 302A, 302B, 302C, 302D, 302E, 302F, 302G, 302H. The configuration of a single-width board is the same whether it is used in a half-height or full-height AdvancedMC module. The same is true for double-width boards. In the case of half-height modules, sets of dual-height rails 304 are employed to guide the card edges of each module.

ATCA carrier board 300 includes four AdvancedMC connectors 306A, 306B, 306C, and 306D. Each AdvancedMC connector has one of two possible configurations, referred to as style "AB" (for single-sided connections), and style A+B+ (for double sided connections). The lower connector slot on a AdvancedMC connector is referred to as slot "A", while the upper connector slot is referred to as slot "B," hence the names "AB" and "A+B+."

The front panel of an AdvancedMC module may generally include provisions for various input/output (I/O) ports via which external devices may communicate with a module. For illustrative purposes, The AdvancedMC modules of FIGS. 2 and 3 include four RJ-45 Ethernet jacks 310. Various other types of I/O ports may also be employed, including, but not limited to universal serial bus (USB) ports, serial ports, infared ports, and IEEE 1394 ports. (It is noted that the mechanical interface for each port is typically coupled to the PCB card, with an appropriately-sized aperture defined in the front panel). A front panel may also include various indicators, such as light-emitting diodes (LEDs) 312, for example, as well as input switches (not shown). In addition, a front panel will typically include a handle or similar means for grasping a module when it is being installed or removed from a carrier board, such as depicted by a handle 314.

In each of FIGS. 2 and 3, a latching mechanism is not illustrated. This is by intent. The introduction of the AdvancedMC modules creates a conflict between the conventional ATCA carrier board latching mechanisms depicted in FIG. 1 and the AdvancedMC module front panel space. In particular, the location of handles 100A and 100B prevents I/O connector access in at least two of the AMC sites. Additionally, a handle can be easily lifted incidentally by I/O cables attached to nearby AdvancedMC modules. As a result, any displacement of the handles from the front panel will signal a request to remove power in order to remove the ATCA board. (Per the ATCA base specification, a microswitch is employed to detect when handles 100A and 100B are in their latched positions—a slight rotation of either handle will be detected by a corresponding microswitch. Such detection indicates that the user is attempting to remove the board (e.g., during a hot-swap operation)). Accordingly, a power down sequence is immediately initiated, such that power is not provided during board removal.

Another important drawback of the conventional insertion ejection mechanism of FIG. 1 is that it prevents an AdvancedMC module proximate to a handle from being removed (e.g., during a hot-swap operation) without first moving the handle. This, of course, initiates a board removal power-down sequence, which is not desired. Thus, such AdvanceMC modules effectively are prevented from being removed without taking the ATCA board hosting the module off-line, defeating the hot-swap benefit provided by the AdvancedMC architecture.

An alternative latch configuration that does not interfere with the AdvancedMC module front panel space has been discussed during AdvancedMC committee meetings. This configuration employs an extended latch that extends outward from the ATCA carrier front panel. Although this solves the interference problem, the extended latch actually increases the likelihood of accidentally signaling intent to hot swap an ATCA board. The extended latch is easily nudged by passing personnel, which effectively results in putting the affected ATCA board out of service by removing payload power to the board.

In accordance with aspect of embodiments of the invention now described, folding latching mechanisms are provided that facilitate both a secure latching function while not interfering with the AdvancedMC module front panel space. The folding latching mechanisms also provided enhanced functions, such as detented latching of positions and detection of when a hot-swap operation is being initiated. Furthermore, since the folding latching mechanisms do not interfere with the AdvancedMC module front panel space, hot swap operations corresponding to all the AdvancedMC modules configurations defined by the AMC.0 specification may be performed without taking the host ATCA board off-line.

Various isometric views of one embodiment of a folding latching mechanism 400 are shown in FIGS. 4a-4d. The latching mechanism includes a latch member 401 to which a lever arm 402 is pivotally coupled about a pivot axis A. A claw-shaped clasp 404 is defined in latch member 401 including a notch 406 and a cam 408 formed on the foot portion of a leg 410. An aperture 412 is formed toward one end of latch member 401 comprising a counterbore 414 and a through hole 416 along a pivot axis B. A pair of hinge members 418 and 420 are formed toward an opposite (of aperture 412) end of latch member 401. Meanwhile, lever arm 402 includes a hinge member 422 at one end, and a push tab 424 disposed toward the cantilevered end of the lever arm. The hinge members 418, 420, and 422 are pivotally-coupled via a hinge pin 426 disposed along pivot axis A to form a hinged joint.

The hinge joint is merely illustrative of one type of joint that may be used to pivotally couple lever arm 402 to latch member 401. For example, a hinge joint of this type might be employed if the lever arm and latch member are manufactured via sheet metal stamping and/or bending operations. In another embodiment illustrating a folding latching mechanism 400A shown in FIG. 4e, one or both of a latch member 401A and lever arm 402A are formed using a casting, molding, machining, and/or forging operation for a metal or plastic, such that hinge members 418 and 420 are replaced by cylindrical lobes 419 and 421, and hinge member 422 is replaced by a cylindrical lobe 423. In this instance, the pivotal joint may be formed by defining a bore through each of cylindrical lobes 419, 421, and 423 and installing a pin 426.

In the embodiment shown in FIGS. 4a-d, aperture 412 is configured to function as the bearing half of a pivot joint comprising a shaft and bearing pair. In this instance, counterbore 414 functions as a journal or plane bearing. Optionally, the counterbore may function as a bearing housing. In another embodiment of a folding latching mechanism 402B shown in FIG. 4f, a latch member 401B employs a stub shaft 415 having a centerline coincident with pivot axis B in place of aperture 412. Under this embodiment, the stub shaft would rotate within a bearing member that is operatively coupled to the carrier board frame or formed therein (not shown). In general, in respective embodiments, each of the aperture 412 and stub shaft 415 serve the function of a pivot member that interfaces to a mating pivot member operatively coupled to a carrier board frame or the like to facilitate a pivotal coupling about pivot axis B. This pivotal coupling is illustrated in FIGS. 6a-i and discussed in further detail below.

In one embodiment, the location of clasp 406 relative to pivot axis B is configured to facilitate an over-center latching mechanism. That is, the location of clasp 406 is "over" the centerline X of aperture 412 with respect to the handle's longitudinal axis Y. This produces a latching effect when the handle is rotated, causing the handle to be secured (latched in place).

Figure 4A:
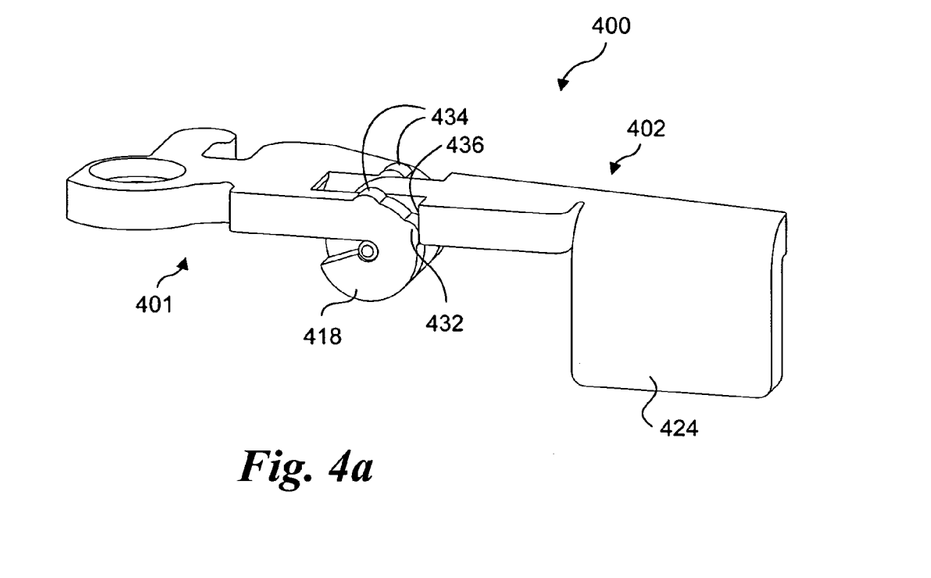
FIGS. 4a and 4b show isometric view of a folding latching mechanism in an extended configuration, according to one embodiment of the invention.
Figure 4B:
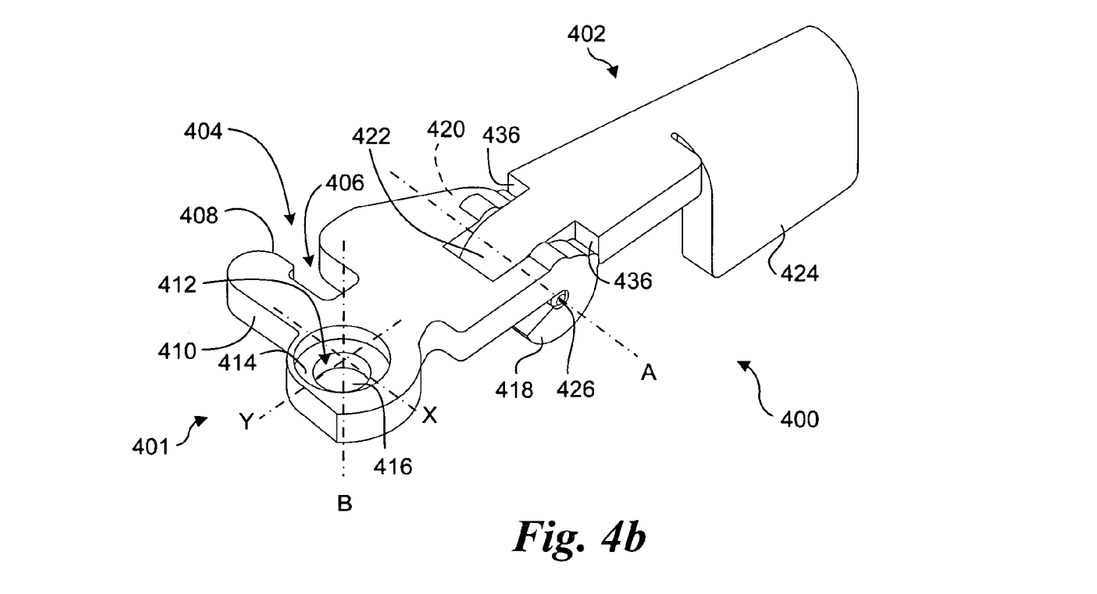
Figures 4C, 4D:
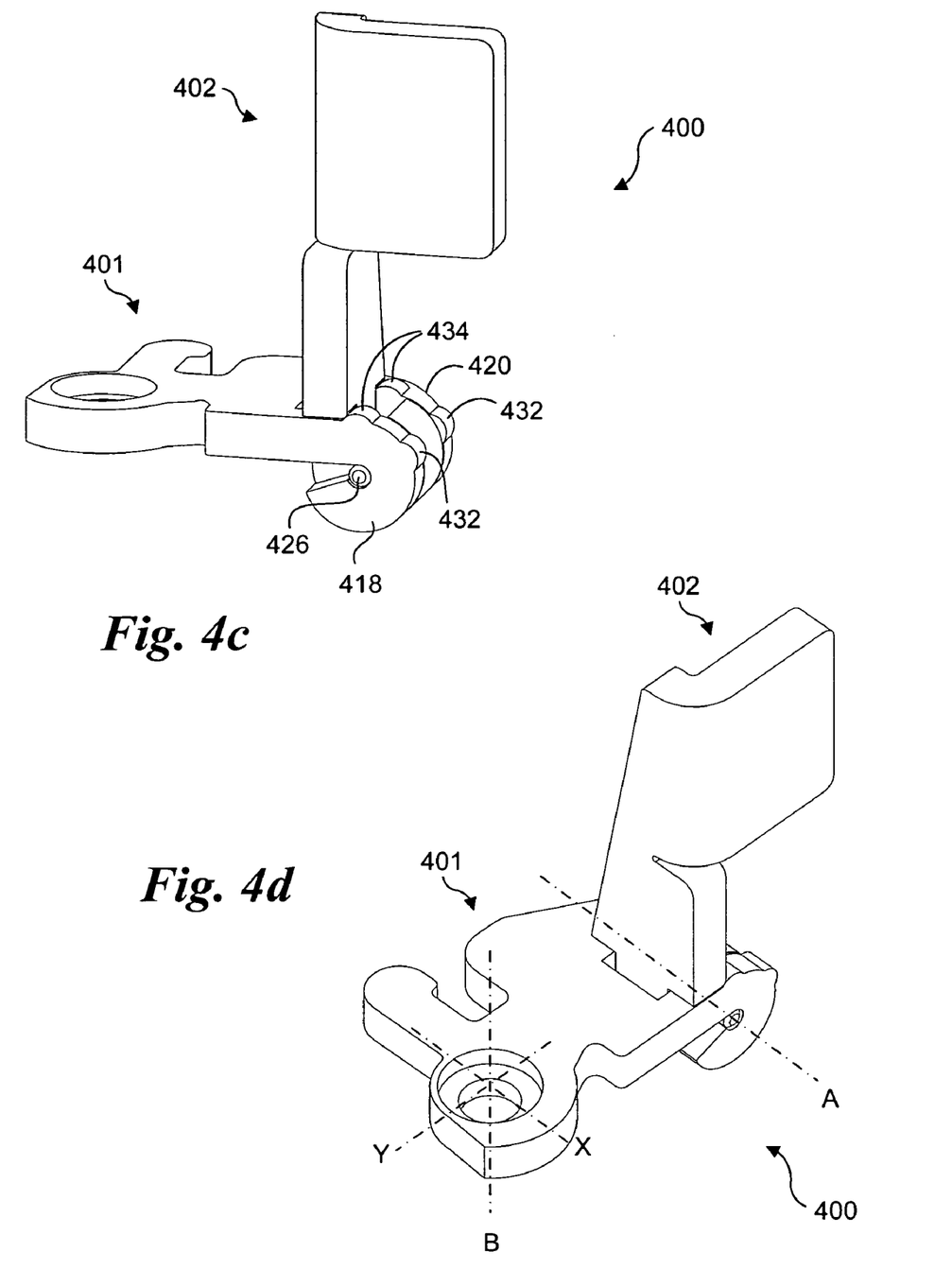
FIGS. 4c and 4d show isometric views of the folding latching mechanism of FIGS. 4a and 4b in a folded configuration.
Figure 4E:
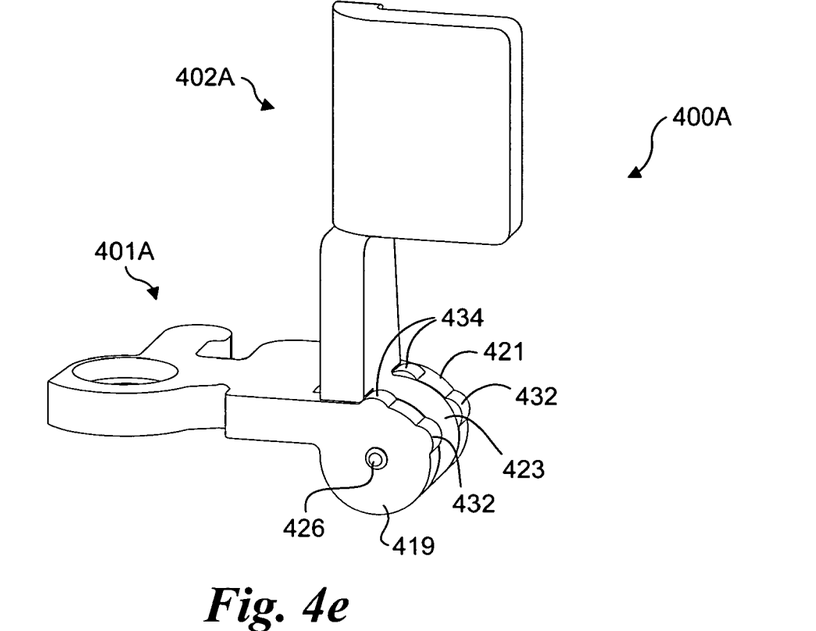
FIG. 4e shows an isometric view of one embodiment of a folding latching mechanism that employs an alternative hinge joint to that shown in FIGS. 4a-d.
Figure 4F:
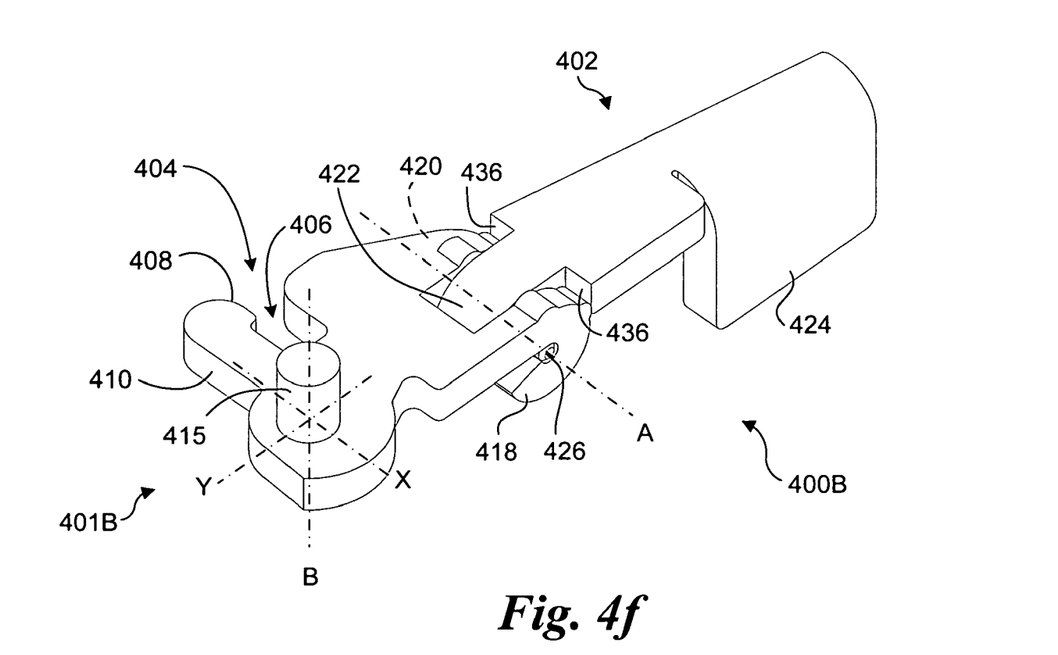
FIG. 4f shows an isometric view of one embodiment of a folding latching mechanism that employs a stud shaft as a pivot member.

Another feature of folding latching mechanism 400 is the ability to maintain lever arm 402 in an extended (FIGS. 4a and 4b) or folded (FIGS. 4c and 4d) position. In one embodiment, this function is facilitated by a pair of protrusions 432 and 434 formed over hinge arms 418 and 420. As shown in the extended position of FIG. 4A, protrusions 432 performs a detent-type function by engaging an ends 436 of lever arm 402. As shown in FIG. 4C, protrusions 434 engages ends 436 to maintain folding latching mechanism 400 in a folded position.

Figure 5:
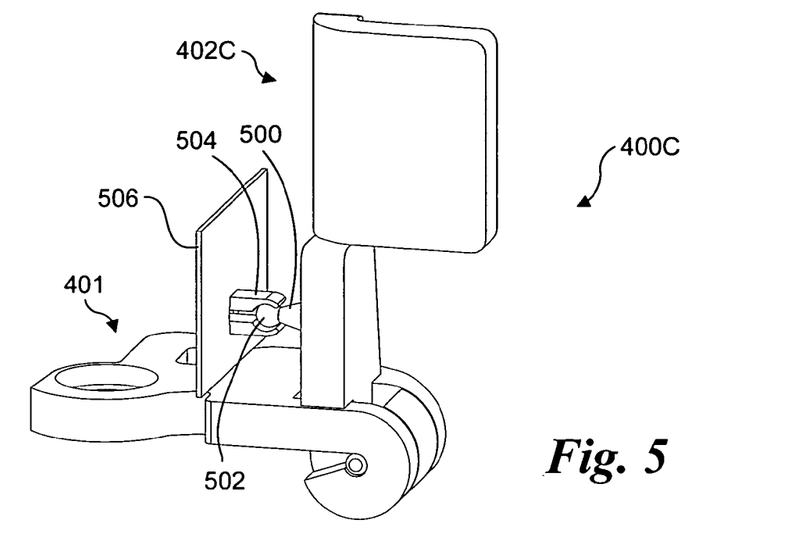
FIG. 5 shows an isometric view of one embodiment of a latching mechanism that maintains the lever arm of a folding latching mechanism in a folded position.

In the embodiment of a folding latching mechanism 400C shown in FIG. 5, a ball and socket-type latching mechanism is employed for maintaining a lever arm 402C in a folded position relative to a latching member 401. In one embodiment, a post 500 with a ball 502 formed at its top end is attached to lever arm 402B or integrally formed therewith. The ball 502 engages a socket 504 attached to a faceplate 506 of an ATCA carrier board (faceplate 506 is only partially shown in FIG. 5 for illustrative purposes). In another embodiment shown in FIG. 7 and described in further detail below, a cutout is formed in an AdvancedMC module or carrier board faceplate, and is configured to engage a ball formed on the top end of post such that the ball extends into the cutout when the lever arm is in the folded position. In both embodiments, a detent-type latching function is provided.

Other mechanisms may be employed to keep folding latching mechanism 400 in an extended and/or folded position. For example, a spring-loaded mechanism with or without detents may be employed. In another embodiment, a magnet-based mechanism may be employed. For example, a magnet may be mounted on the faceplate and exert a magnetic holding force on a member made of a magnetic material (e.g., steel) that extends from the lever arm. In another configuration, the faceplate is made of a magnetic material, and the magnet is coupled to the lever arm.

Figure 6A:
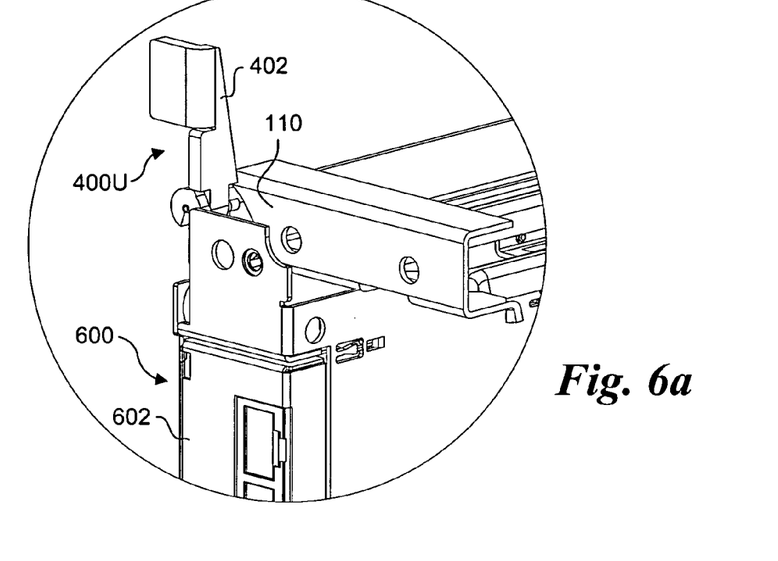
Figure 6B:
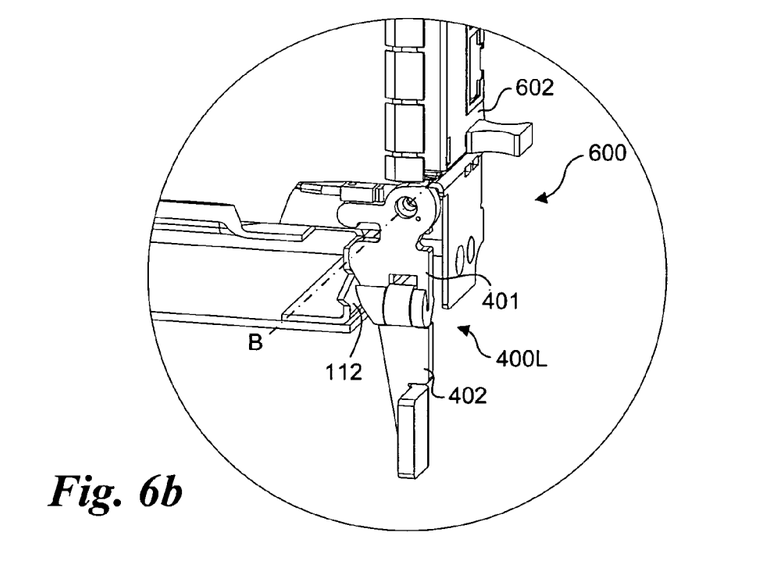

An exemplary latching sequence that secures an ATCA board 600 with a plurality of AdvancedMC modules 602 into an ATCA chassis 114 is illustrated in FIGS. 6a-i. The start of the sequence is illustrated in FIGS. 6a and 6b, wherein each of an upper folding latching mechanism 400U and a lower folding latching mechanism 400L are shown in an initial extended unlatched configuration. The latching members 401 for each upper and lower folding latching mechanisms 400U and 400L are pivotally coupled toward the top and bottom of an ATCA board carrier frame 604; for clarity, the portion of the carrier frame at where the pivotal coupling exists is not shown in FIGS. 6b, 6d, 6f, and 6h to better illustrate the operation of the folding latching mechanisms. In this initial configuration, the latching members 401 are disposed in vertical positions, with a leading edge abutting against an upper flange 110 and a lower flange 112 (as shown in FIG. 6b) of ATCA chassis 114.

Figure 6C:
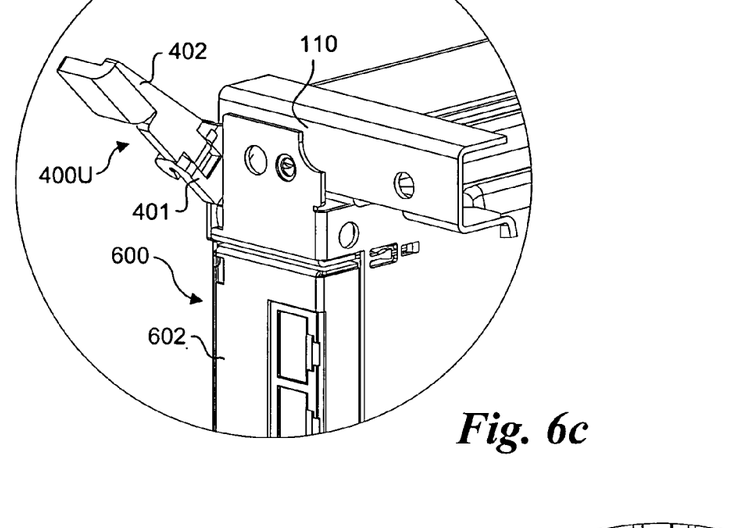
Figure 6D:
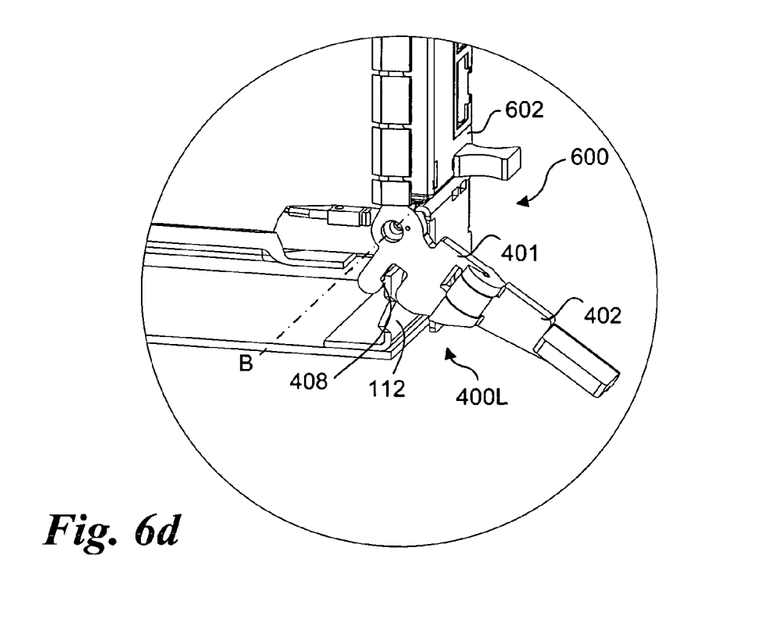
Figure 6E:
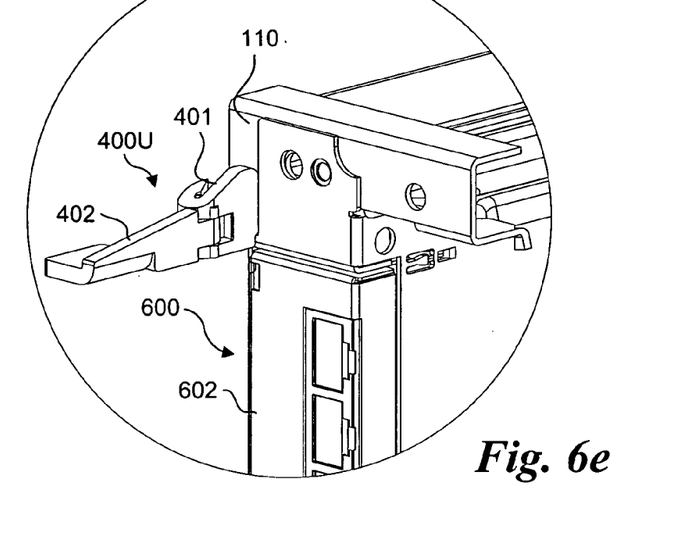
Figure 6F:
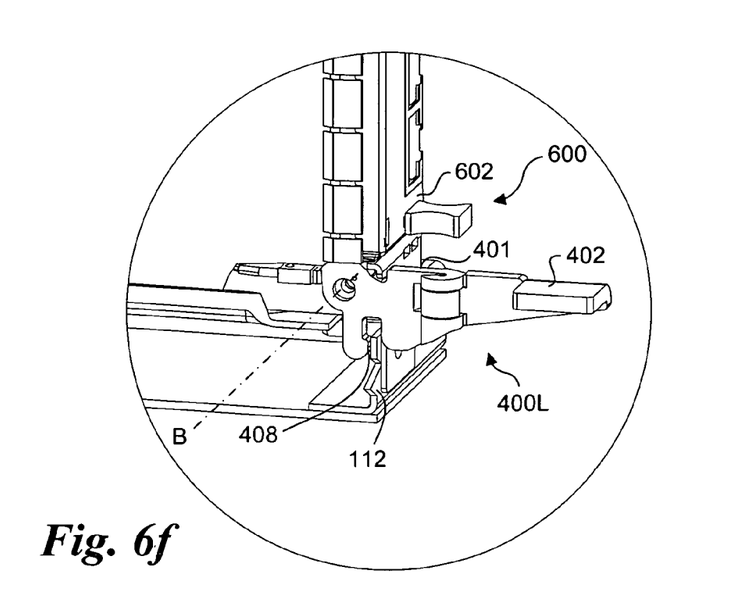

As shown in FIGS. 6c and 6d, the lever arm 401 of upper folding latching mechanism 400U is rotated downward while the lever arm 401 of lower folding latching mechanism 400L is rotated upward to move ATCA board 600 into the ATCA chassis. As shown in FIG. 6d, this rotate causes cam 408 to engage the backside of lower flange 606. This rotation is continued until the position shown in FIGS. 6e and 6f is reached. At this point, each of the upper and lower folding latching mechanisms 400U and 400L are in a horizontal position, with the lever arms 401 extending outward from the front panels of the AdvancedMC modules 602. As discussed above, in one embodiment (such as shown in FIGS. 6a-h), the latching members 401 are configured to support an over-center latching mechanism. Once the latching members are rotated into their respective latched positions (e.g., the position shown in FIG. 6f), the only way to extract the ATCA board is to move the lever arms 402 outward.

Figure 6G:
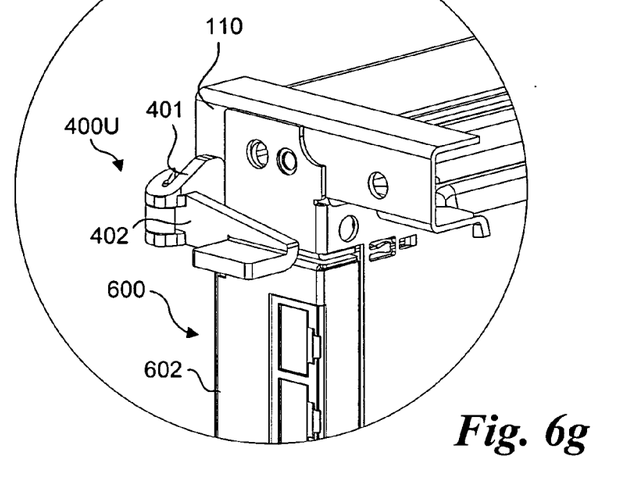
Figure 6H:
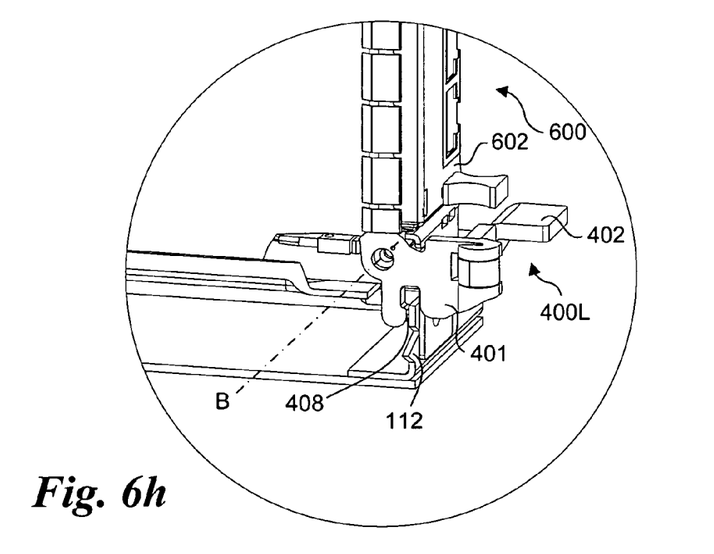
Figure 6I:
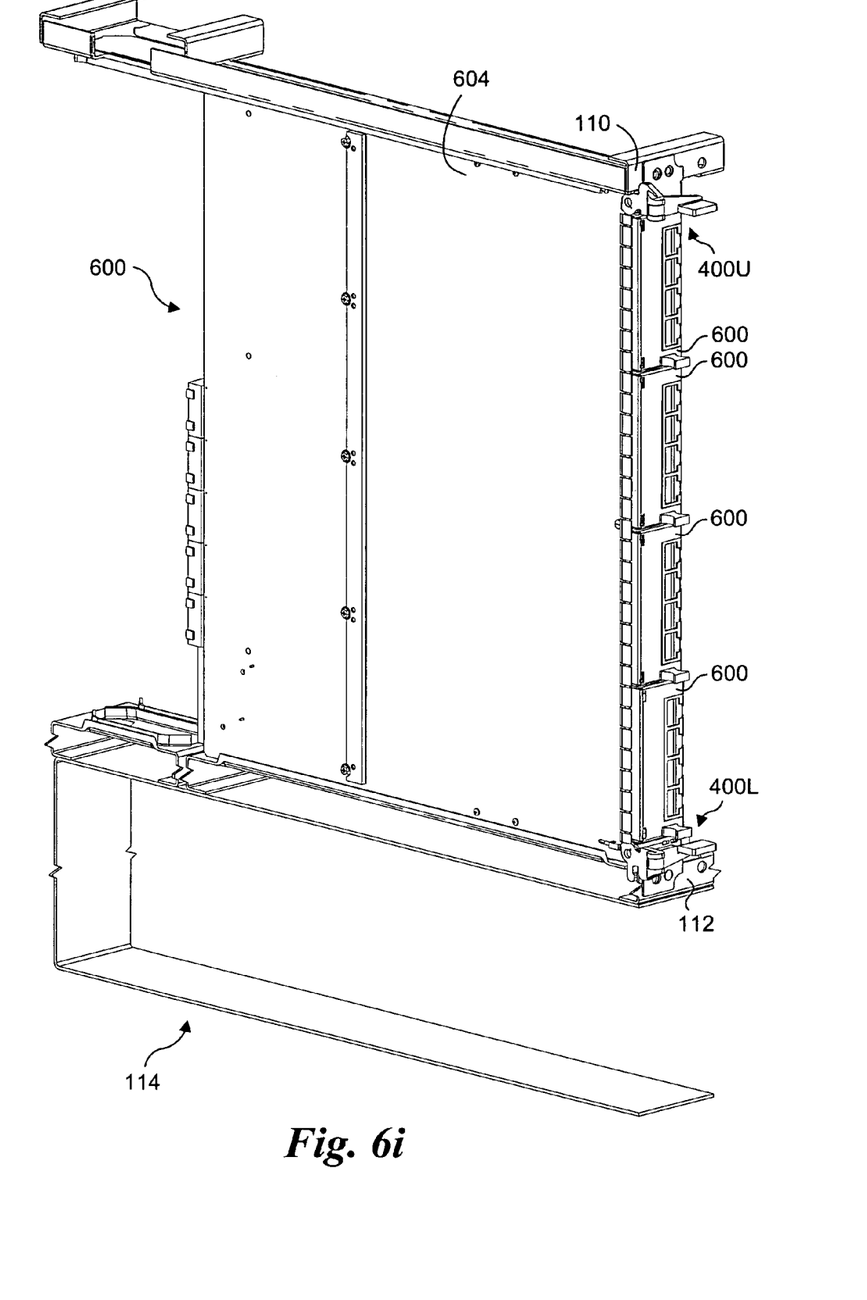
FIG. 6i is an isometric view showing an ATCA board installed in an ATCA chassis in accordance with the folding latching mechanism configuration of FIGS. 6g and 6h.

In the configuration shown in FIGS. 6e and 6f, inadvertent rotation of either of the upper or lower folding latching mechanisms might occur. However, this potential problem is addressed by folding the lever arms 401 inward, as depicted in FIGS. 6g and 6h. As discussed above, in some embodiments a latching mechanism is employed for latching the lever arms 401 in their folded positions. Thus, in the configuration shown in FIGS. 6g and 6h, the ATCA board is secured within the ATCA chassis, and the lever arms are secured in their folded positions. This latched and secured position is further illustrated in FIG. 6i.

Another aspect of some embodiments is a latch position detection function. As discussed above, the ATCA specification provides support for hot-swapping ATCA boards. To facilitate this, a power sequence is specified that removes power to the board being removed/replaced. Accordingly, a means is needed to determine when a board is about to be removed.

Figure 7:
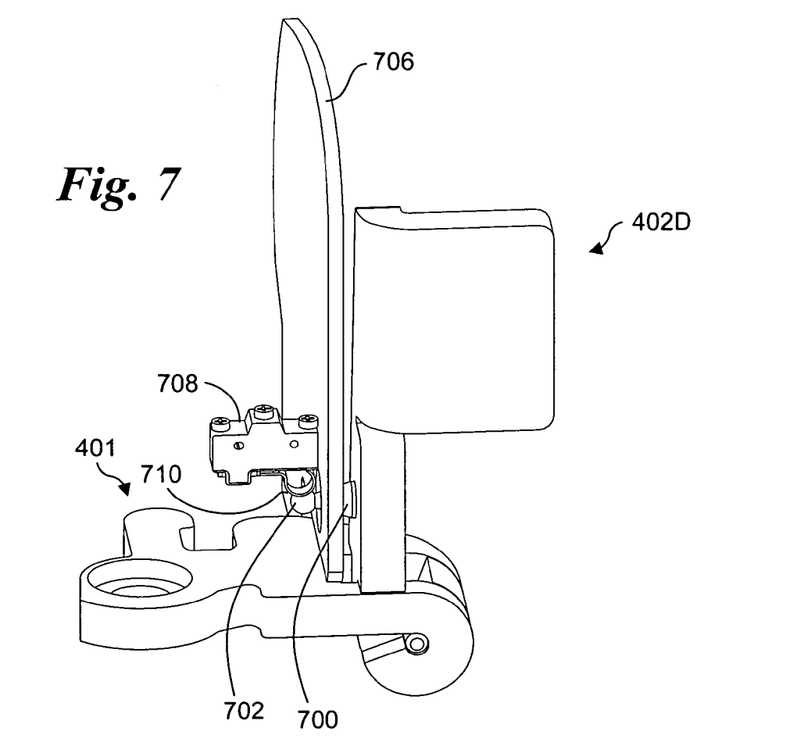
FIG. 7 shows an isometric view of one embodiment of a folding latching mechanism position detection scheme, wherein the position of the lever arm is detected.

One embodiment of a configuration that provides a latch position detection function is shown in FIG. 7. A post 700 with a ball 702 is coupled to or integrated into a lever arm 402D. The ball 702 slightly engages the edges of a slot 704 formed in a faceplate 706 when lever arm 402D is rotated into the folded position depicted in FIG. 7. For example, the width of slot 704 is slightly less than the diameter of ball 700, with the ball being made of a deformable material, such as a plastic. Thus, this configuration provides a latching function to maintain the folded position for the lever arm.

In addition to the latching function, a latch position detection function is also provided. In the illustrated embodiment, a microswitch 708 is operatively coupled to faceplate 706 or relative to faceplate 706 (e.g. the microswitch is mounted to a circuit board that is not shown). When ball 702 is passed through slot 704, an actuator 710 for microswitch 708 is engaged. Thus, the microswitch 708 detects that latch arm 402C is in the folded position. Furthermore, in order to reach the folded position, it will first be necessary rotate latching member 401 so that it is properly engaged with one of the upper or lower flanges 110 or 112, as shown in FIGS. 6e-f. As a result, when the microswitch 708 detects that latch arm 402C is in its folded position, it may also be determined that the folding latching mechanism is in its secured latched position.

In response to outward rotation of lever arm 402C, post 700 and ball 702 will be moved outward relative to faceplate 706, causing actuator 710 of microswitch 708 to disengage with ball 702, deactivating the microswitch. This informs the ATCA system that lever arm 402C is no longer in its folded position. This provides two functions. If a lever arm is not in its folded position, personnel may inadvertently bump the lever arm in a manner that causes the ATCA board to be partially extracted while it is being supplied with power. Since this is not desired, the system may be configured such that power is removed whenever microswitch 708 is disengaged. Another enhancement is that it takes a finite amount of time to rotate the lever arm outward about its folding axis prior to rotating the lever arm and latching member about the latter's pivot axis (B) to extract the board. This provides an extra margin of time to remove power when compared with the conventional handle scheme of FIG. 1, since under the conventional scheme the detection of a board being extracted occurs at the same time the board is actually extracted.

There are other schemes that also may be employed for detecting the position of the lever arm and/or latching member. For example, proximity switches, such as capacitive sense switches, magnetic-based switches, and the like may be employed for this type of detection purpose. Typically, the switch body would be operatively coupled to a faceplate or circuit board that is fixed relative to the faceplate. Some types of proximity switches may employ a sensed component that would be affixed to the component being moved, such as a small magnet for some types of magnetic-based proximity switches. In other instances, the proximity of the component being moved is directly detected by a sensor in the proximity switch itself, without requiring an additional sensed component.

For illustrative purposes, the foregoing embodiments where configured and described in the context of their contemplated use in an ATCA environment. However, the ATCA environment is merely illustrative of one modular board environment in which the principles and teachings of the embodiments of the invention described herein may be applied. In general, similar configurations may be deployed for other standardized and proprietary board insertion and ejection mechanisms.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. An apparatus comprising:
   a latching member, having a pivot member disposed toward a first end having a centerline defining a first pivot axis and a claw-shaped clasp disposed proximate to the first pivot axis; and
   a lever arm, pivotally-coupled to the latching member toward a second end of the latching member opposite the first end to define a second pivot axis that is substantially perpendicular to the first pivot axis.

2. The apparatus of claim 1, further comprising:
   means for maintaining the lever arm in a folded position relative to the latching member.

3. The apparatus of claim 1, further comprising:
   means for maintaining the lever arm in an extended position relative to the latching member.

4. The apparatus of claim 1, wherein the claw-shaped clasp is located relative to the first pivot axis to effect an over-center latching configuration.

5. The apparatus of claim 1, wherein the lever arm is pivotally-coupled to the latching member via a hinged joint.

6. The apparatus of claim 1, wherein the lever arm includes a push tab disposed toward a cantilevered end of the lever arm.

7. The apparatus of claim 1, wherein the pivot member comprises a counterbore having a through hole, each of the counterbore and through hole having a centerline along the first pivot axis.

8. The apparatus of claim 1, wherein the pivot member comprises a stub shaft having a centerline along the first pivot axis.

9. An apparatus comprising:
   a carrier board frame including a faceplate having a top and bottom; and
   first and second folding latching mechanisms, each including,
      a latching member, pivotally-coupled toward a first end with the carrier board frame to define a first pivot axis and including a claw-shaped clasp disposed proximate to the first pivot axis; and
      a lever arm, pivotally-coupled to the latching member toward a second end of the latching member opposite the first end and defining a second pivot axis that is substantially perpendicular to the first pivot axis,
   wherein the latching member of the first folding latching mechanism is pivotally coupled to the carrier board frame proximate to the top of the faceplate, and the latching member of the second folding latching mechanism is pivotally coupled to the carrier board frame proximate to the bottom of the faceplate.

10. The apparatus of claim 9, further comprising:
    means for maintaining the lever arms for each of the first and second folding latching mechanisms in a folded position under which the lever arms are folded over a front of the faceplate.

11. The apparatus of claim 9, further comprising:
    means for maintaining the lever arms for each of the first and second folding latching mechanisms in an extended position relative to their respective latching member.

12. The apparatus of claim 9, wherein the claw-shaped clasp for the latching member of each of the first and second folding latching mechanisms is located relative to that latching member's first pivot axis to effect an over-center latching configuration.

13. The apparatus of claim 9, further comprising:
    means for detecting whether the latching member for at least one of the first and second folding latching mechanisms is rotated about its respective first pivot axis at a latching position.

14. The apparatus of claim 9, further comprising:
    means for detecting whether the lever arm for at least one of the first and second folding latching mechanisms is rotated about its respective second pivot axis at a folded position.

15. The apparatus of claim 14, wherein the means for detecting whether the lever arm for at least one of the first and second folding latching mechanisms is rotated about its respective second pivot axis at a folded position comprises a mechanically-actuated switch that is actuated by an actuation member coupled to the lever arm.

16. The apparatus of claim 9, wherein the carrier board frame and first and second folding latching mechanisms are configured to interface with an Advanced Telecom Computing Architecture (ATCA) chassis.

17. Advanced Telecom Computing Architecture (ATCA) board, comprising:
    an ATCA carrier board including support components to interface with at least one Advanced Mezzanine Card (AdvancedMC) module;
    a carrier board frame to which the ATCA carrier board is mounted, including a faceplate having a top and bottom and configured to receive said at least one AdvancedMC module; and first and second folding latching mechanisms, each including, a latching member, pivotally-coupled to one of the ATCA carrier board or ATCA carrier board frame to effect rotation relative to the carrier board frame about a first pivot axis and including a claw-shaped clasp disposed proximate to the first pivot axis; and a lever arm, pivotally-coupled to the latching member toward a second end of the latching member opposite the first end and defining a second pivot axis that is substantially perpendicular to the first pivot axis, wherein the first folding latching mechanism is disposed proximate to the top of the faceplate, and the second latching member is disposed proximate to the bottom of the faceplate.

18. The ATCA board of claim 17, further comprising:

at least one Advanced MC module, installed on the ATCA carrier board.

19. The ATCA board of claim 17, further comprising:

means for detecting whether the lever arm for each of the first and second folding latching mechanisms is rotated about its respective second pivot axis at a folded position.

20. The ATCA board of claim 17, further comprising:

means for maintaining the lever arms for each of the first and second folding latching mechanisms in a folded position under which the lever arms are folded over a front of the faceplate.

21. The ATCA board of claim 17, further comprising one or more protrusions on a hinge arm to help maintain the lever arm in a folded position relative to the latching member.

22. The ATCA board of claim 21, further comprising a ball and socket-type mechanism to help maintain the lever arm in the folded position relative to the latching member.

23. The ATCA board of claim 17, further comprising a ball and socket-type mechanism to help maintain the lever arm in a folded position relative to the latching member.

* * * * *